United States Patent [19]

Harwood et al.

[11] Patent Number: 5,266,889
[45] Date of Patent: Nov. 30, 1993

[54] WAFER PROBE STATION WITH INTEGRATED ENVIRONMENT CONTROL ENCLOSURE

[75] Inventors: Warren K. Harwood, Vancouver, Wash.; Martin J. Koxxy, Hillsboro, Oreg.; Paul A. Tervo, Vancouver, Wash.

[73] Assignee: Cascade Microtech, Inc., Beaverton, Oreg.

[21] Appl. No.: 891,232

[22] Filed: May 29, 1992

[51] Int. Cl.⁵ ..................... G01R 31/02; G01R 1/073
[52] U.S. Cl. ............................ 324/158 F; 324/158 P
[58] Field of Search ............... 324/158 F, 158 P, 72.5, 324/73.1

[56] References Cited

U.S. PATENT DOCUMENTS 3,710,251 1/1973 Hagge et al. ..................... 324/158 F
4,115,736 9/1978 Tracy ............................... 324/158 F
5,077,523 12/1991 Blanz ............................... 324/158 P

OTHER PUBLICATIONS

Micromanipulator Company, Inc., "Test Station Accessories," 1983.
Temptronic Corporation, "Application Note 1-Controlled Environment Enclosure for Low Temperature Wafer Probing in a Moisture-Free Environment," undated.
Temptronic Corporation, "Model TPO3000 Series Thermo Chuck Systems," undated.
Y. Yamamoto, "A Compact Self-Shielding Prober for Accurate Measurement of On-Wafer Electron Devices," *IEEE Trans., Instrumentation and Measurement,* vol. 38, pp. 1088-1093, 1989.

*Primary Examiner*—Ernest F. Karlsen
*Attorney, Agent, or Firm*—Chernoff, Vilhauer, McClung & Stenzel

[57] ABSTRACT

A wafer probe station is equipped with a compact, integrated controlled-environment enclosure providing EMI shielding, substantially hermetic sealing for a dry purge gas for low-temperature testing, and a dark environment. The sealing isolation of the wafer chuck and test probe provided by the enclosure is maintained despite the fact that the probe and chuck positioning mechanisms extend partially outside the enclosure, with positioning members extending movably between the interior and exterior of the enclosure. Sealing is maintained by movable sealing members at the locations where the positioning members penetrate the enclosure.

6 Claims, 6 Drawing Sheets

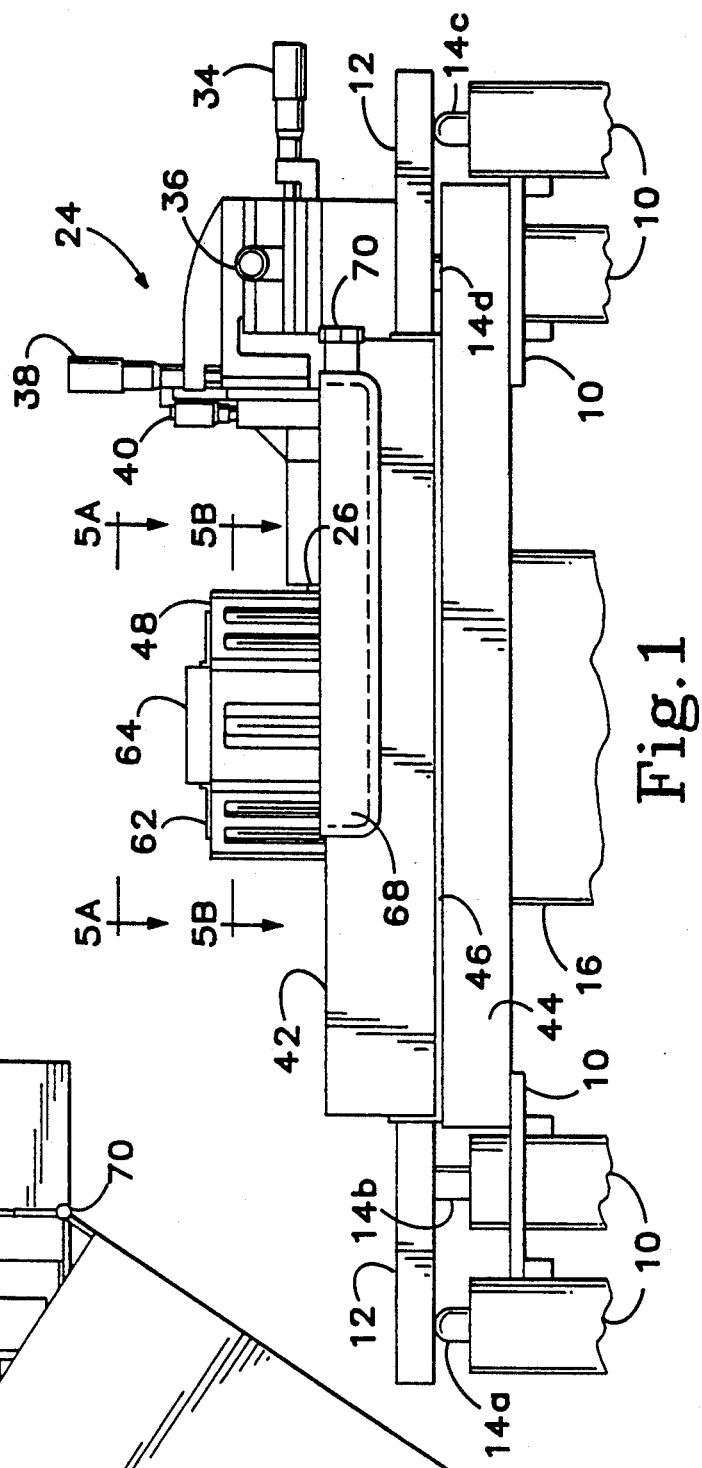
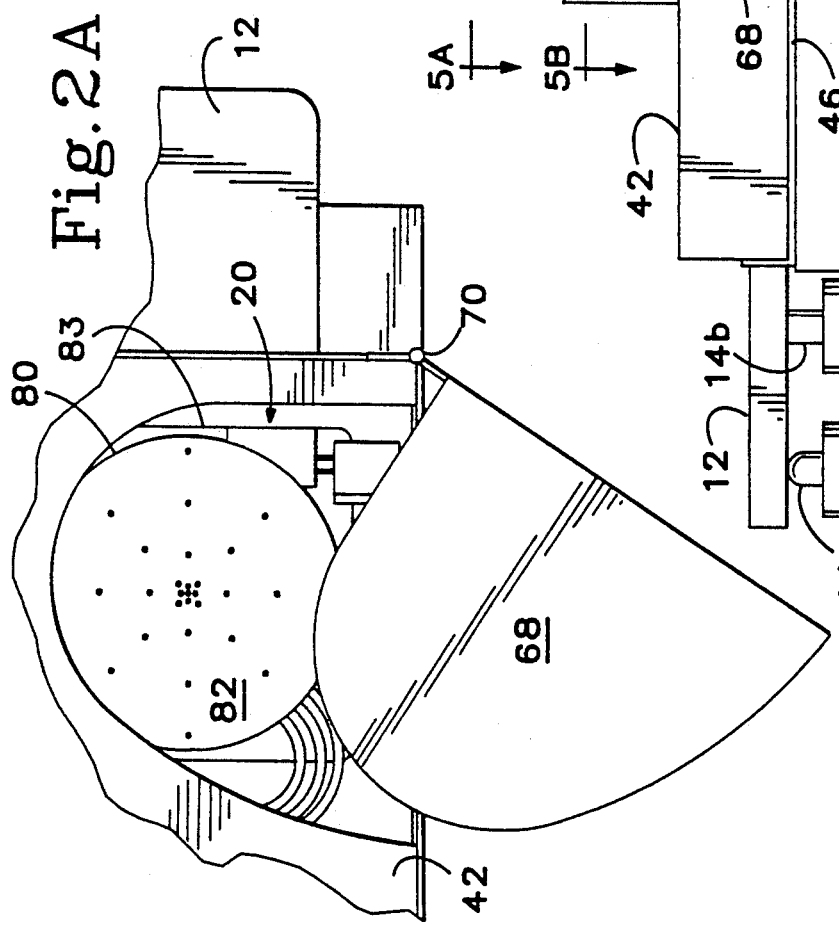
Fig.1
Fig.2A

WAFER PROBE STATION WITH INTEGRATED ENVIRONMENT CONTROL ENCLOSURE

BACKGROUND OF THE INVENTION

The present invention is directed to probe stations for making highly accurate measurements of high-speed, large scale integrated circuits at the wafer level, and of other electronic devices. More particularly, the invention relates to such a probe station having a controlled-environment enclosure for isolating the wafer-supporting chuck and probe(s) from outside influences such as electromagnetic interference (EMI), moist air during low-temperature measurements, and/or light.

For sensitive probing applications where electromagnetic interference or light must be eliminated, or where probing must be conducted at low test temperatures, an enclosure must be provided surrounding the test area. For low-temperature testing, the enclosure must provide a substantially hermetic seal for the introduction of a dry purge gas, such as nitrogen or dry air, to prevent condensation of moisture onto the wafer at the low test temperature.

Two different approaches have been used in the past for providing a controlled-environment enclosure. One approach has been to provide a large enclosure which surrounds the entire probe station, including its chuck and/or probe positioning mechanisms, as exemplified by the controlled-environment enclosures marketed by the Micromanipulator Company, Inc. of Carson City, NV and Temptronic Corporation of Newton, MA. However such large enclosures have several drawbacks. One of these is that they require the user to manipulate the station controls through the confines of rubber gloves mounted on the enclosure, making set-up and operation of the probe station more difficult and time-consuming for the operator. Another drawback is that the large volume of these enclosures requires a large volume of dry purge gas, requiring a correspondingly high charging cost after each unloading and loading sequence, and a correspondingly high cost of the purge gas. These large enclosures also occupy an excessive amount of valuable laboratory space. Finally, where the enclosure surrounds the entire probe station, the device being tested is not shielded from the electromagnetic interference of probe station positioning motors and other sources of electrical noise on the station itself.

An alternative approach to controlledenvironment enclosures for probe stations is a compact, integrated enclosure as exemplified in an article by Yousuke Yamamoto, entitled "A Compact Self-Shielding Prober for Accurate Measurement of On-Wafer Electron Devices," appearing in *IEEE Transactions on Instrumentation and Measurement*, Volume 38, No. 6, Dec, 1989, pp. 1088-1093. This controlled-environment enclosure is very compact since it is part of the probe station structure and encloses only the wafer-supporting surface of the chuck and the probe tips. While the small, integral enclosure solves some of the aforementioned problems of the larger enclosures, it is incapable of maintaining any electromagnetic or hermetic seal during relative positioning movement between the chuck wafer-supporting surface and the probe tips along the axis of approach by which the probe tips and chuck approach or withdraw from each other. Such a drawback is particularly critical with respect to thermal testing requiring a dry purge gas, since each repositioning of the wafer and probe relative to each other opens the enclosure and therefore requires re-purging. Moreover no individual probe tip movement to accommodate different contact patterns is provided with such an enclosure, thus sacrificing flexibility of the probe station to test a wide variety of different devices.

SUMMARY OF THE PRESENT INVENTION

The present invention compatibly solves all of the foregoing drawbacks of the prior probe stations by providing a probe station having an integrated environment control enclosure of relatively small size, with the positioning mechanism or mechanisms which position the probe(s) and/or wafer relative to each other being located at least partially outside of the enclosure. Despite the small size of the enclosure, however, the integrity of its EMI, hermetic, and/or light sealing capability is maintained throughout movement by the positioning mechanism of the wafer supporting surface or probe holder along the axis of approach, or along the other positioning axes. Such maintenance of the sealing integrity of the enclosure despite positioning movement is made possible by extending the positioning mechanism or mechanisms movably and sealably between the exterior and interior of the enclosure.

The sealing provided by the enclosure in the preferred embodiment is effective with respect to all three major environmental influences, i.e. EMI, substantial air leakage, and light; however it is within the scope of the invention for the sealing capability to be effective with respect to any one or more of these influences, depending upon the application for which the probe station is intended. Likewise, in the preferred embodiment, multiple positioning mechanisms extend between the exterior and interior of the enclosure for positioning the wafer-supporting surface, the probes independently, and the probes in unison; however it is within the scope of the invention to provide any one or more of such positioning mechanisms in conjunction with the enclosure.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 is a partial front view of an exemplary embodiment of a wafer probe station constructed in accordance with invention.

FIG. 2A is a partial top view of the wafer probe station of FIG. 1 with the enclosure door shown partially open.

DESCRIPTION OF THE PREFERRED EMBODIMENT

Figure 2:
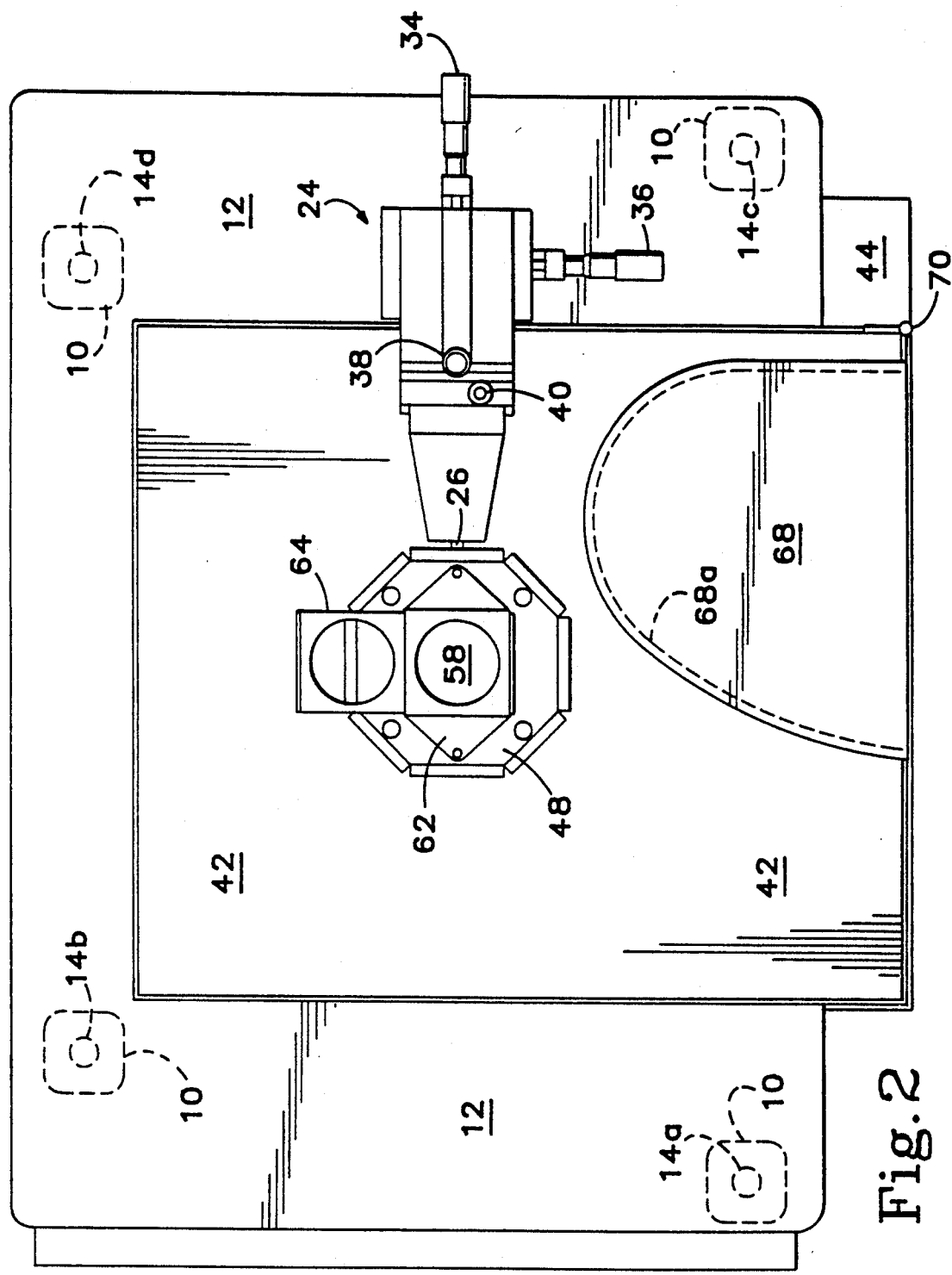
FIG. 2 is a top view of the wafer probe station of FIG. 1.
Figure 3:
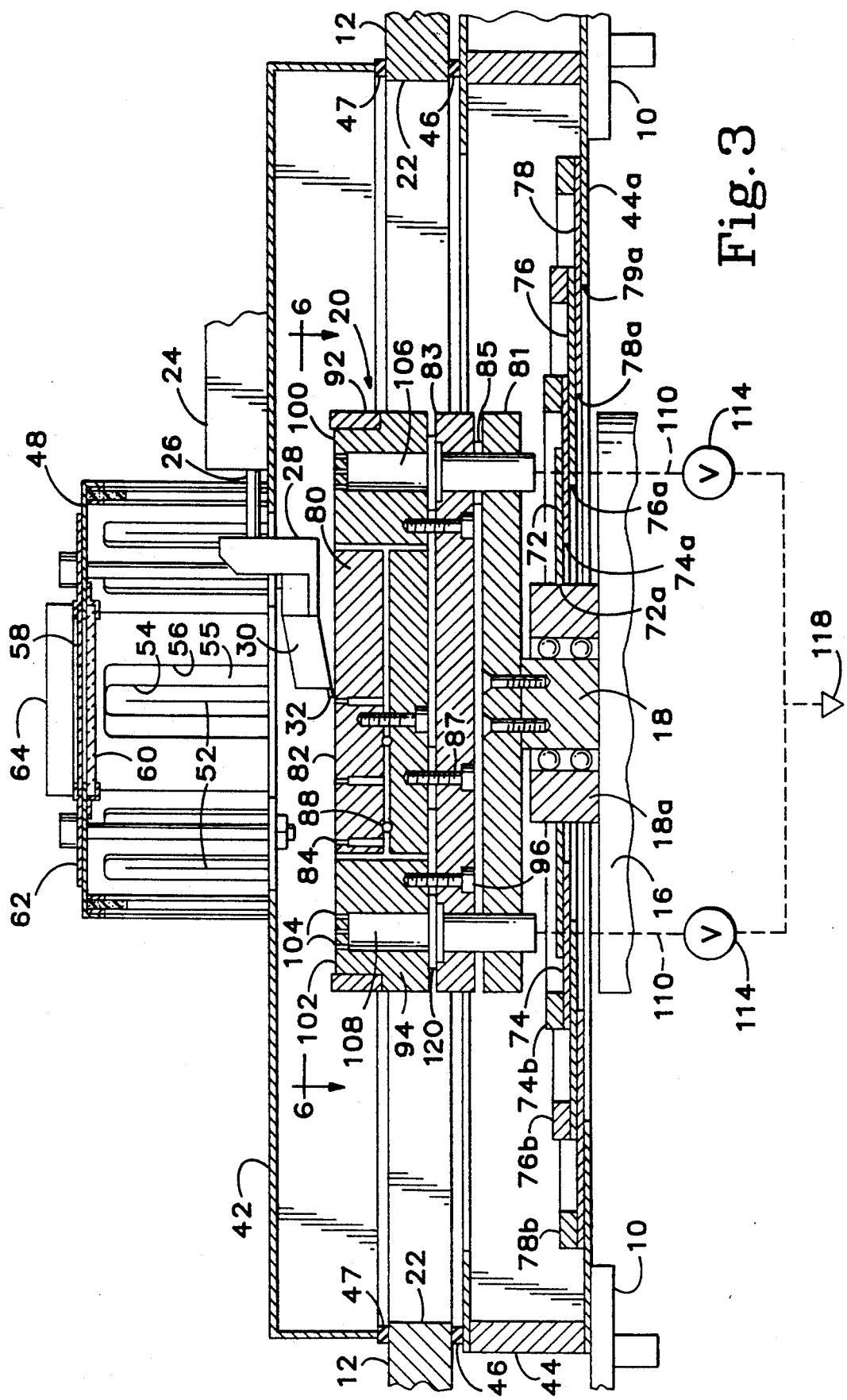
FIG. 3 is a partially sectional and partially schematic front view of the probe station of FIG. 1.

With reference to FIGS. 1, 2 and 3, an exemplary embodiment of the probe station of the present invention comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized wafer positioner 16 having a rectangular plunger 18 which supports a movable chuck assembly 20. The chuck assembly 20 passes freely through a large aperture 22 in the platen 12 which permits the chuck assembly to be moved independently of the platen by the positioner 16 along X, Y and Z axes, i.e. horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective wafer probe 30. The wafer probe 30 has a downwardly-inclined coplanar transmission line probe tip 32 for contacting wafers and other test devices mounted atop the chuck assembly 20, although other kinds of tips can be used as well. The probe positioner 24 has micrometer adjustments 34, 36 and 38 for adjusting the position of the probe holder 28, and thus the probe 30, along the X, Y and Z axes respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 so that the plane of the probe tip 32 can be made parallel to the plane of the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

Figure 5A:
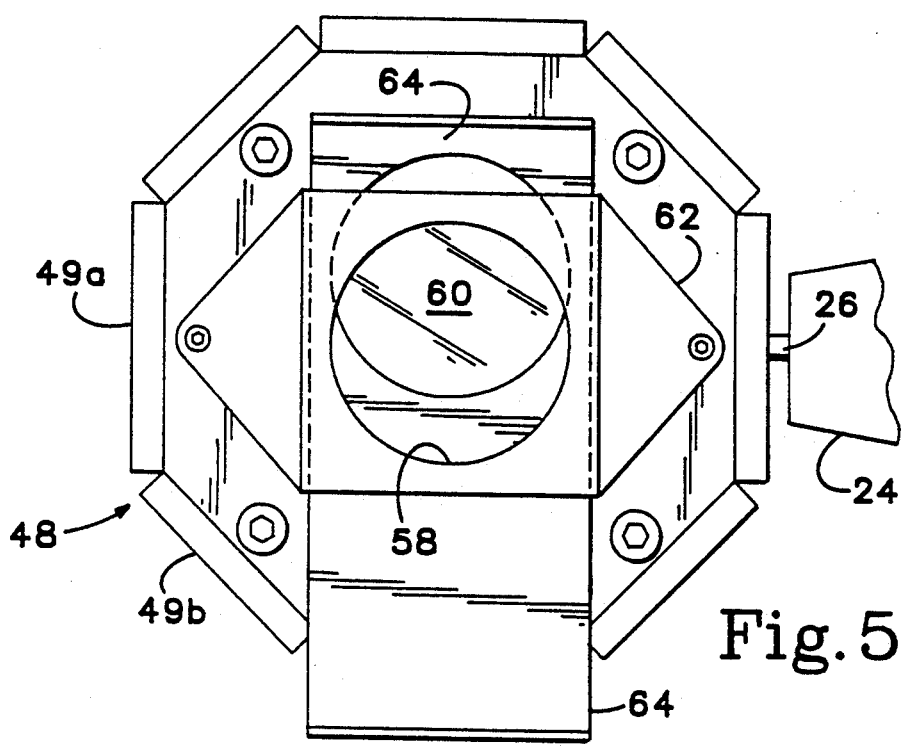
FIG. 5A enlarged top detail view taken along line 5A—5A of FIG. 1.
Figure 5B:
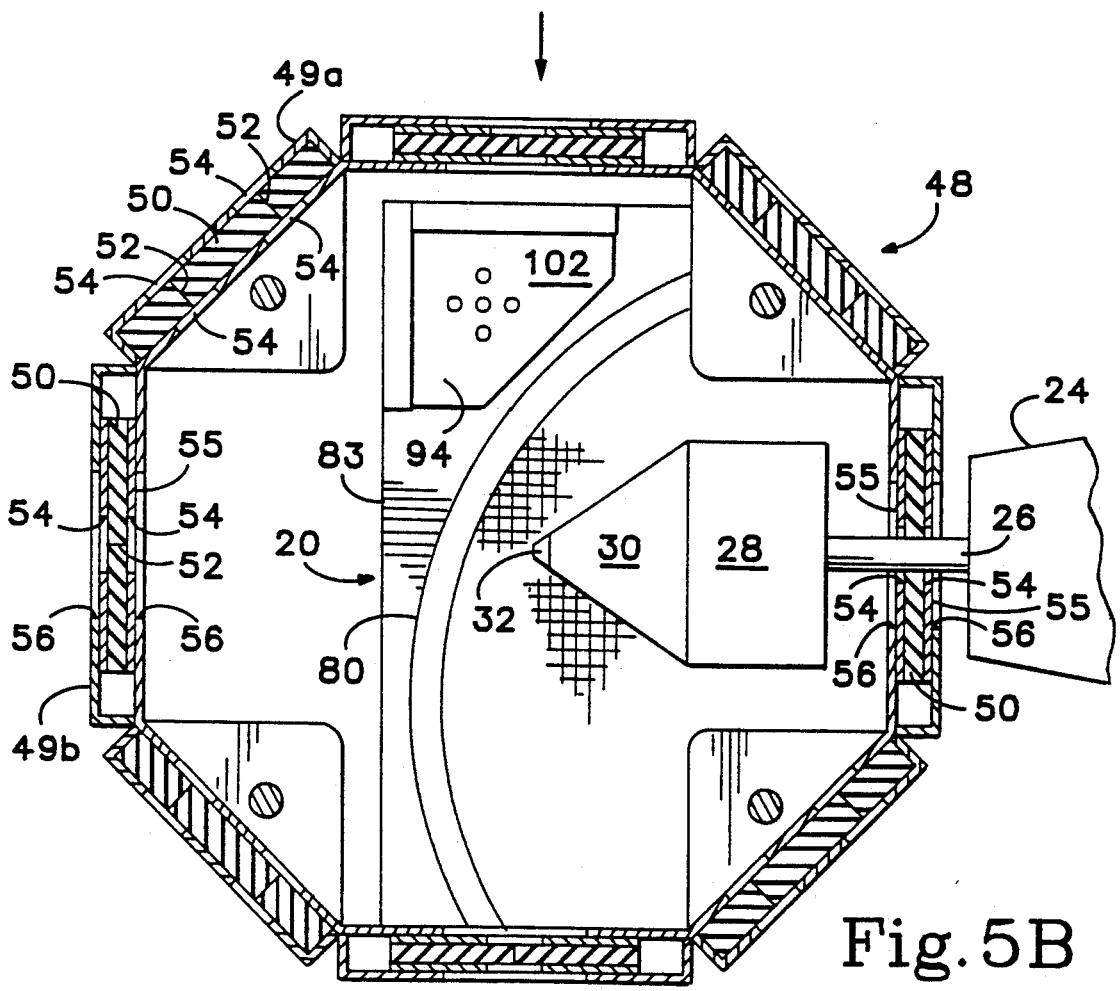
FIG. 5B enlarged top sectional view taken along line 5B—5B FIG. 1.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the aboveidentified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing.

The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

Figure 4:
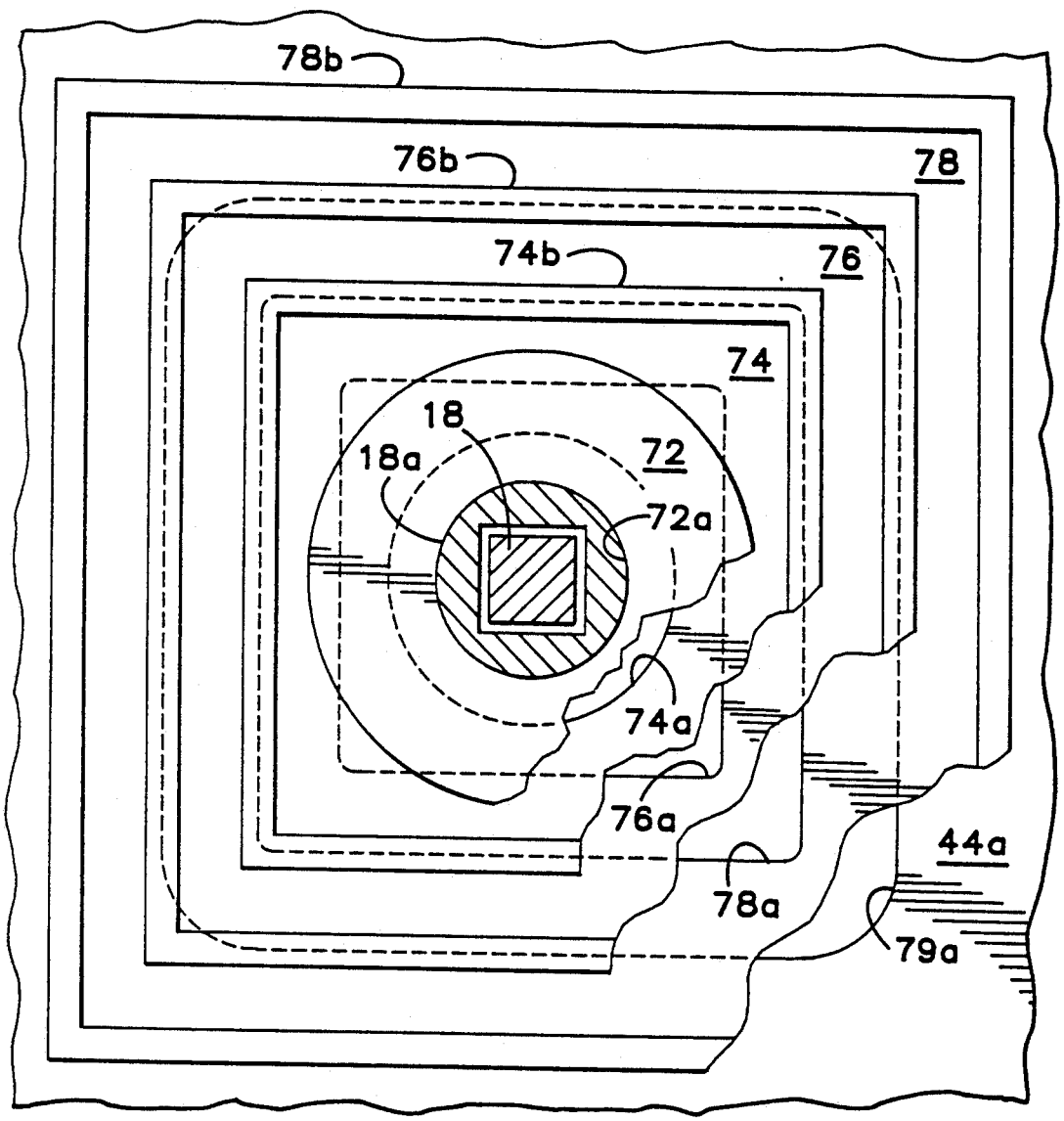
FIG. 4 is a top view of the sealing assembly where the wafer mechanism extends through the bottom of the enclosure.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

Figure 6:
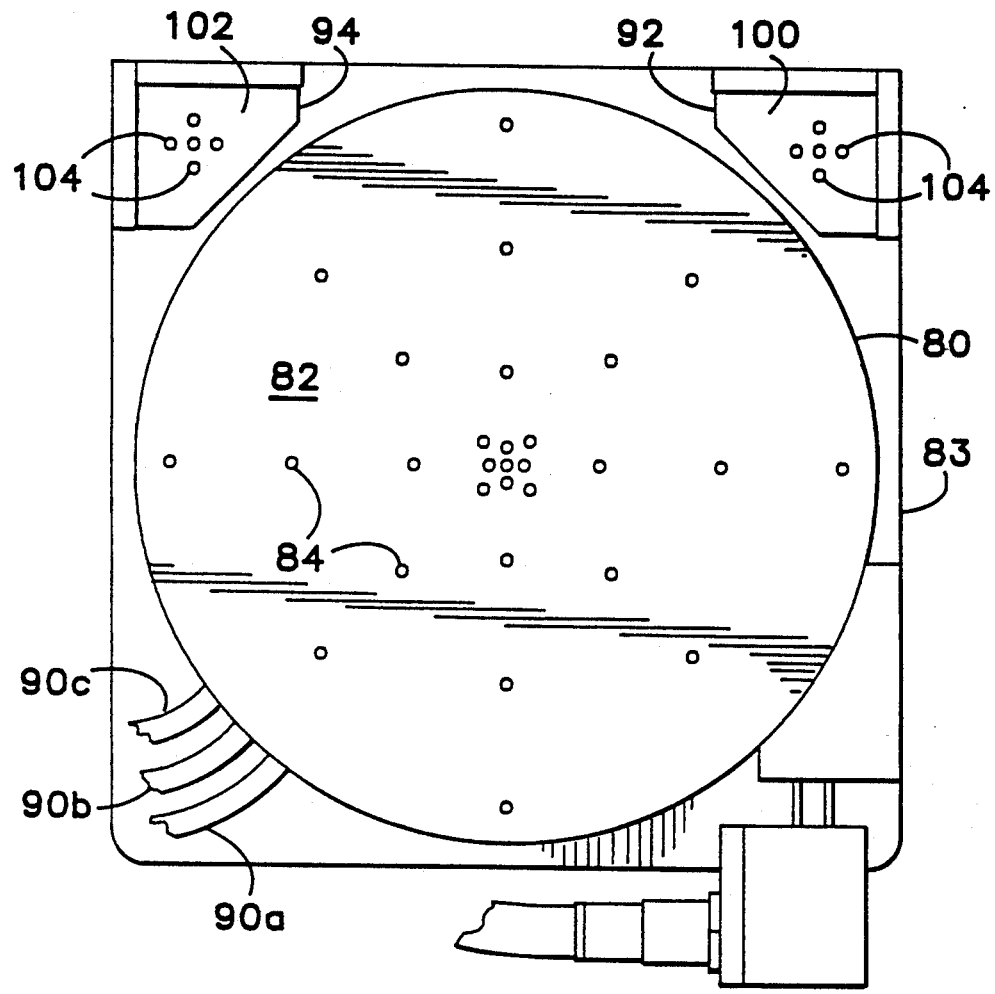
FIG. 6 is a top detail view of the chuck assembly, taken along line 6—6 of FIG. 3.

With particular reference to FIGS. 3 and 6, the chuck assembly 20 is of a unique modular construction usable either with or without an environment control enclosure. The plunger 18 supports an adjustment plate 81 which in turn supports a rectangular stage 83 which detachably mounts a circular wafer chuck 80 of conventional design by means of screws such as 87. Shims such as 85 providing leveling. The wafer chuck 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular wafer chuck 80, up to four auxiliary chucks such as 92 and 94 are detachably mounted on the corners of the stage 83 by screws such as 96 independently of the wafer chuck 80. Each auxiliary chuck 92, 94 has its own separate upwardly-facing planar surface 100, 102 respectively, in parallel relationship to the surface 82 of the wafer chuck 80. Vacuum apertures 104 protrude through the surfaces 100 and 102 from communication with respective chambers 106, 108 within the body of each auxiliary chuck. Each of these chambers in turn communicates through a separate vacuum line 110 and a separate independently-actuated vacuum valve 114 with a source of vacuum 118 as shown schematically in FIG. 3. Each of the valves 114 selectively connects or isolates a respective chamber 106 or 108 with respect to the source of vacuum independently of the operation of the apertures 84 of the wafer chuck 80, so as to selectively hold or release a contact substrate or calibration substrate located on the respective surfaces 100 and 102 of the auxiliary chucks independently of the wafer.

The detachable interconnection of the auxiliary chucks 92 and 94 with respect to the wafer chuck 80 enables not only the independent replacement of the different chucks but also enables the respective elevations of the surfaces of the chucks to be adjusted vertically with respect to each other. As shown in FIG. 3, auxiliary chuck shims such as 120 can be inserted between the stage 83 and the auxiliary chuck to adjust the elevation of the auxiliary chuck's upper surface relative to that of the wafer chuck 80 and the other auxiliary chuck(s). This compensates for any differences in thicknesses between the wafer, contact substrate and calibration substrate which are simultaneously carried by the chuck assembly 20, so that the probes are easily transferable from one to the other without differences in contact pressure or the threat of damage to the probe tips.

When used with an environment control enclosure, the vacuum valves 114 of the respective auxiliary chucks are located remotely from the chucks, and preferably exterior of the enclosure as indicated schematically in FIG. 3 to enable control of the auxiliary chucks despite the impediment to access created by the enclosure. This enables use of auxiliary chucks compatibly with such an enclosure, which is particularly critical because the presence of the auxiliary chucks eliminates the need for repetitive unloading and loading of contact substrates and calibration substrates during set-up and calibration, and thus eliminates the attendant need for repetitive and time-consuming purging of the environment control enclosure. The modular, detachably interconnected chuck assembly is also particularly advantageous when combined with a controlled-environment probe station because of the need for interchangeability of the numerous different types of wafer chucks usable with such a probe station.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe station comprising:
   (a) a substantially planar surface for holding a test device on said surface;
   (b) a holder for an electrical probe for contacting the test device;
   (c) a pair of positioning mechanisms for selectively moving both said surface and said holder, independently of each other, toward or away from the other along an axis of approach; and
   (d) an enclosure surrounding said surface for maintaining a seal around said surface despite movement by said positioning mechanisms of either one of said surface and holder, respectively, toward or away from the other along said axis of approach, said pair of positioning mechanisms each being located at least partially outside of said enclosure.

2. The probe station of claim 1 wherein said seal is a substantially hermetic seal.

3. The probe station of claim 1 wherein said seal comprises a shield against electromagnetic interference.

4. The probe station of claim 1 further comprising a plurality of holders for electrical probes for contacting the test device, and a plurality of positioning mechanisms, each for selectively moving a respective holder independently of other said holders.

5. The probe station of claim 4 further comprising a third positioning mechanism for selectively moving said plurality of holders in unison relative to said surface.

6. The probe station of claim 1 wherein said seal is a light seal for maintaining darkness within said enclosure during movement of said pair of positioning mechanisms.

* * * * *

UNITED STATES PATENT AND TRADEMARK OFFICE
CERTIFICATE OF CORRECTION

PATENT NO. : 5,266,889
DATED : November 30, 1993
INVENTOR(S) : Warren K. Harwood, Martin J. Koxxy, Paul A. Tervo It is certified that error appears in the above-indentified patent and that said Letters Patent is hereby corrected as shown below:

Column 1, Line 49: delete "controlledenvironment" insert --controlled environment--

Column 2, Line 51: after "with" insert --the present--

Column 2, Line 61: after "wafer" insert --positioning--

Column 2, Line 63: after "FIG. 5A" insert --is an--

Column 2, Line 65: after "FIG. 5B" insert --is an--

Column 2, Line 66: after "5B-5B" insert --of--

Column 4, Line 13: delete "aboveidentified" insert --above identified--

Signed and Sealed this

Sixth Day of December, 1994

Attest:

BRUCE LEHMAN

Attesting Officer     Commissioner of Patents and Trademarks